United States Patent [19]
Peyrat

[11] 3,984,788
[45] Oct. 5, 1976

[54] NEGATIVE RESISTANCE MICROWAVE POWER GENERATOR

[75] Inventor: André Peyrat, Paris, France

[73] Assignee: Thomson-CSF, Paris, France

[22] Filed: Nov. 19, 1975

[21] Appl. No.: 633,598

[30] Foreign Application Priority Data
Nov. 21, 1974 France .............................. 74.38282

[52] U.S. Cl. ........................... 331/107 R; 331/101; 331/56
[51] Int. Cl.² ......................................... H03B 7/12
[58] Field of Search ...................... 331/107, 96, 56; 330/56

[56] References Cited
UNITED STATES PATENTS

| | | | |
|---|---|---|---|
| 3,452,305 | 6/1969 | Hefni | 331/96 |
| 3,628,171 | 12/1971 | Kurokawa | 331/56 |
| 3,810,045 | 5/1974 | Ruttan | 331/96 |
| 3,931,587 | 1/1976 | Harp | 331/56 |

*Primary Examiner*—John Kominski
*Attorney, Agent, or Firm*—Karl F. Ross; Herbert Dubno

[57] ABSTRACT

A microwave power generator comprises a cavity resonator and at least two oscillators built using transmission lines and negative resistance diodes, magnetically coupled to the resonator. At least one additional oscillator is added and electrically coupled to the resonator at a point where the electric field is at a maximum, increasing the volumetric power delivered by the generator, by 50%.

4 Claims, 5 Drawing Figures

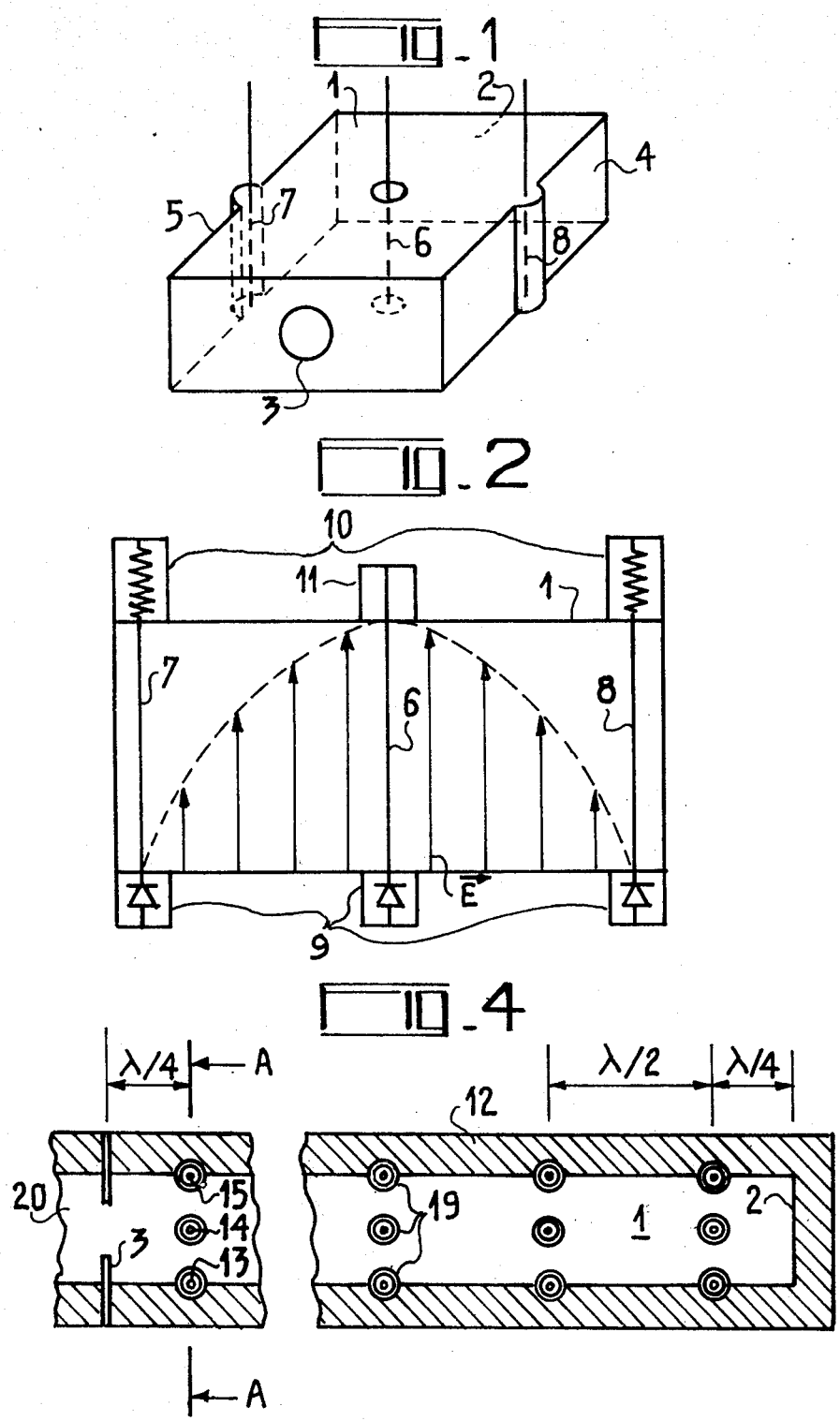

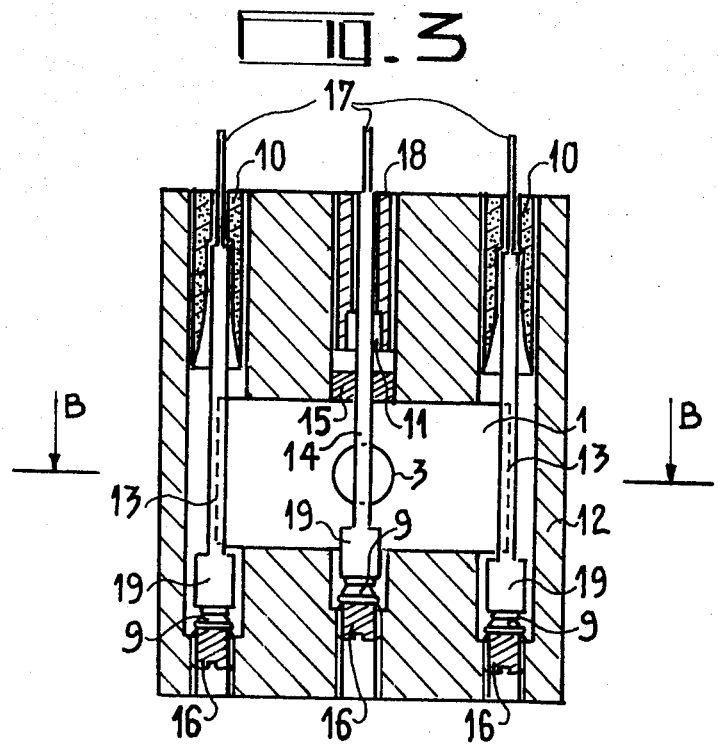
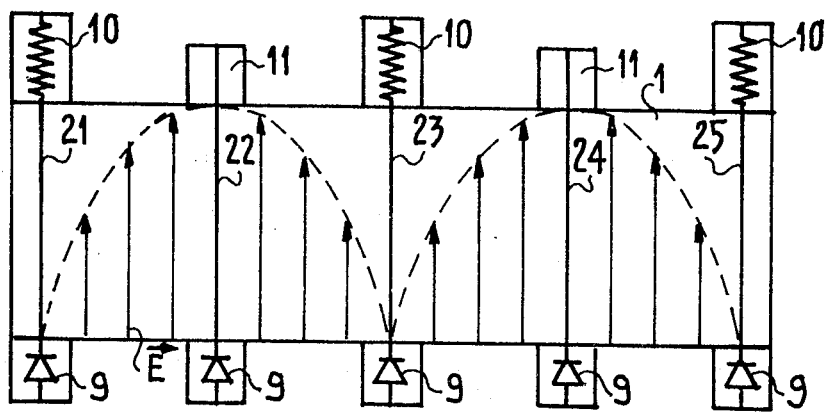

NEGATIVE RESISTANCE MICROWAVE POWER GENERATOR

The present invention relates to microwave power generators using negative resistance diodes, and relates more particularly to generators combining the powers furnished by several negative resistance oscillators.

It is already known to combine a cavity resonator with at least two oscillators each comprising a section of coaxial transmission line with, at one of its ends, a negative resistance element and, at the other end, a matched termination, the transmission line being coupled to the cavity resonator at points of maximum magnetic field strength. It is thus possible to design generators capable of delivering powers substantially higher than the power which could be furnished by an oscillator containing only one diode.

It is possible, however, and this is the object of the present invention, to design generators comprising a larger number of oscillators, which are therefore capable of producing an even higher overall power, without increasing the volume of the generator.

In accordance with one feature of the invention, there is provided a microwave power generator comprising a cavity resonator, an output transmission line coupled to the cavity resonator, at least two oscillators, each comprising a coaxial transmission line section with, at one of its two ends a negative resistance element and at the other a match termination, said oscillators having their transmission lines coupled to the cavity resonator at points where the magnetic field is substantially maximum, and at least a third oscillator coupled to the cavity resonator at a point where the electric field is substantially maximum.

In accordance with another feature of the invention, the cavity resonator is a rectangular cavity which is operated in the fundamental TE $01n$ mode, the generator employing $3n$ oscillators, where $n$ designates a whole number, the $2n$ first oscillators being arranged close to two lateral walls of the cavity and spaced apart by half a wavelength, and the $n$ other oscillators being located along the central axis of the cavity.

The oscillators located at the points of maximum electric field strength, are constituted by a section of coaxial transmission line provided at one of its ends with a negative resistance element and at the other end with a polarisation trap.

The negative resistance element is generally an avalanche diode of the IMPATT type (this is an abbreviation for Impact Ionisation Avalanche and Transit Time diode).

Other features and advantages will be better understood from a consideration of the ensuing description illustrated in the figures where:

FIG. 1 is a schematic illustration of a cavity containing three oscillators in accordance with the invention.

FIG. 2 is a schematic illustration of a section through the cavity of FIG. 1, in the plane containing the oscillators.

FIG. 3 is an embodiment of a generator in accordance with the present invention.

FIG. 4 is a sectional view on the line BB of FIG. 3.

FIG. 5 is a schematic illustration of another embodiment of the invention.

FIG. 1 illustrates the diagram of a generator in accordance with the invention comprising three negative resistance diode oscillators. This generator comprises a parallepiped cavity 1 operating in the TE 011 mode. The cavity is closed at one end by a short-circuit plane 2 and, at the opposite end, a coupling diaphragm 3 makes it possible to extract the generated waves which are transmitted to external circuits (an antenna, a modulator, a duplexer for example), through a waveguide which has not been shown in order not to overburden the figure. The length of the cavity in the TE 011 mode is equal to half a wavelength.

The equations describing the electric and magnetic fields in the cavity, make it possible to determine the axes of maximum field strength in each case, that is to say the locations at which the oscillators are to be coupled.

These axes are located in a plane parallel to the short-circuit plane 2, at an interval of a quarter of a wavelength therefrom. One of these axes 6 is located at the centre of the cavity and corresponds to the maximum electric field strength.

The two other axes 7 and 8 are located in the centre of the short sides 4 and 5 and correspond to the maximum magnetic field strength and the minimum electric field strength.

Three oscillators are therefore created and coupled to the cavity by junctions located on these axes.

FIG. 2 illustrates in schematic section, the plane containing the three oscillators. Each of them is constituted by a coaxial line section. The internal conductors of the lines located close to the sides, extend along a lateral wall of the cavity resonator 1, following the axes 7 and 8. The external conductor is constituted by the internal wall of the cavity which is machined to produce a semi-cylindrical shape as FIG. 1 shows. At one of the ends of the internal conductor, a diode 9 is connected whose other end is connected to the metal earth of the system. At the opposite end to that at which the diode 9 is located, there is a matched load 10, that is to say an impedance close to the characteristic impedance of the coaxial transmission line in which it is included.

The internal conductor of the line, located at the centre of the cavity, extends along the axis 6. To one of the ends, there is connected a diode 9 whilst at the other end a polarisation trap 11 is located. The conventional bias source for the diodes has not been shown since it will be well-known to the person skilled in the art.

The lines of force $\vec{E}$ illustrated, clearly illustrate the differences between the magnetic coupling, where the field $\vec{E}$ is minimum, and the electric coupling where the field is maximum.

FIG. 3 illustrates an example of the generator in accordance with the invention. The cavity 1 is cut in a metal block 12. Cylindrical cavities are formed in the block at the coupling locations referred to earlier. These cavities receive the negative resistance diode oscillators which are coupled to the common resonator 1. The output diaphragm 3 is visible at the base of the cavity. The lateral oscillators comprise an internal conductor 13 which extends along a lateral wall of the resonator 1, in the manner shown in FIG. 4. At the end of each coaxial line, that is to say the end opposite that at which the diode 9 is located, there is a matched load 10. The internal conductor 13 passes through said matched load and is connected to a bias source for the diodes, through cables 17 only exit sections of which have been shown.

The internal conductor 14 of the central coaxial line is terminated, at the side opposite to the diode, in a trap 11 which constitutes a short-circuit for said coaxial line, at the frequency of oscillation. This trap is constituted, for example, and as FIG. 3 shows, by a metal ring 15 and a recessed cylindrical component 18. The distance between the external edge of the ring 15 and the internal face of the cylinder 18, is substantially equal to a quarter wavelength.

As FIG. 4 shows, this being a sectional view taken on the line BB of FIG. 3, the conductors 13 and 14 are located in a right sectional plane of the cavity. Other oscillators can be arranged at other right sections disposed at around half a waveguide wavelength $\gamma_G/2$, from one another. The two terminal sections are located, one at about $\gamma_G/4$ from the terminal short-circuit 2, and the other at about $\gamma_G/4$ from the plane of the diaphragm 3. FIG. 3 is the section defined by the lines AA of FIG. 4.

The diodes 9 are coupled to the lines in order to generate fundamental oscillations at the resonance frequency of the cavity 1. The parasitic modes are eliminated by the matched loads 10. The impedance and matching of the diodes to each coaxial line, is effected by means of transformers 19 of quarter wave design, arranged between each diode and the associated central conductor. The diodes and the transformers are arranged in the metal block 12 and set back in relation to the wall below cavity. Each diode 9 is integral with a screw 16 which serves both as a bias current return and for heat dissipation. Adjustment of the generator, in order to achieve proper operation, consists in influencing the various parameters of the circuit which are primarily the diameters of the quarter wave transformers 19, the penetration of the diodes 9, and the position of the polarisation trap 11 associated with the central diode. Matching of the system is then effected by acting upon the diameter of the output diaphragm 3.

In the case of FIGS. 3 and 4, the resonator 1 is a cavity of rectangular shape having a length of around $n\gamma_G/2$, which resonates in the TE $01n$ mode where $n$ is a whole number equal to a third of the number of diodes used. The lateral diodes are located at points of maximum magnetic field strength and zero electric field strength, whilst the central diodes are located at points of maximum electric field strength. It may be possible, however, to arrange two diodes close together, at either side of a point of maximum magnetic field strength or maximum electric field strength, in order to increase the available power.

Another possibility where the increase of the number of diodes is concerned, is to use a resonator operating in the TE $02n$ mode, as shown in FIG. 5. The schematic section of FIG. 5 corresponds to the section shown in FIG. 2. For this arrangement to be possible, at the requisite frequency, the width of the cavity is increased. The distribution of the lines of force $\vec{E}$ has been shown. There are three minima in the field $\vec{E}$, at the ends and at the centre of the cavity, where there are three magnetic coupling oscillators, and two field maxima respectively at ¼ and ¾ of the width, where two electrically coupled oscillators are disposed. In total, five oscillators are used in each right plane of section of the cavity. In the TE $02n$ mode, it is thus possible to use $5n$ oscillators.

The microwave generator in accordance with the invention can therefore produce a substantial power, proportional to the number of diodes used, and from a reduced volume. The power/volume ratio is particularly high because of the fact that at least three diodes are used for a fundamental TE 01 mode.

The invention is applicable to microwave transmitters operating in the X and Ku bands, and possibly in the C band. It is applicable more generally to any system generating microwave energy.

What is claimed is:

1. A microwave power generator comprising a cavity resonator, an output transmission line coupled to the cavity resonator, at least two oscillators, each comprising a coaxial transmission line section with, at one of its two ends a negative resistance element and at the other a match termination, said oscillators having their transmission lines coupled to the cavity resonator at points where the magnetic field is substantially maximum, and at least a third oscillator coupled to the cavity resonator at a point where the electric field is substantially maximum.

2. A generator as claimed in claim 1, wherein said third oscillator comprises a coaxial transmission line section with a negative resistance element at one and a polarisation trap at the other.

3. A generator as claimed in claim 2, wherein the cavity resonator is a rectangular cavity operating in the TE $01n$ mode, said cavity comprising $3n$ oscillators arranged 3 by 3 at right sections which are spaced apart from one another by half a wavelength, each right section comprising, two oscillators located adjacent the two respective lateral walls and magnetically coupled to the resonator, and a third oscillator located at the centre of the section and electrically coupled to the resonator.

4. A generator as claimed in claim 2, wherein the cavity resonator is a rectangular cavity operating in the TE $02n$ mode, said cavity comprising $5n$ oscillators arranged 5 by 5 at right sections disposed at half a wavelength from one another, each right section comprising two magnetically coupled oscillators arranged adjacent the lateral walls, a third magnetically coupled oscillator located at the centre of the section and two other electrically coupled oscillators, arranged respectively at ¼ and ¾ of the width of said section.

* * * * *